(12) United States Patent
Kim et al.

(10) Patent No.: US 8,650,458 B2
(45) Date of Patent: Feb. 11, 2014

(54) METHODS OF ENCODING/DECODING FOR ERROR CORRECTION CODE UTILIZING INTERDEPENDENT PORTIONS OF CODEWORDS AND RELATED CIRCUITS

(75) Inventors: Kwanho Kim, Suwon-si (KR); Kyoungmook Lim, Hwaseong-si (KR); Jae-Deok Nam, Seongnam-si (KR); Seong Woon Kim, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 95 days.

(21) Appl. No.: 13/316,021

(22) Filed: Dec. 9, 2011

(65) Prior Publication Data

US 2012/0185747 A1 Jul. 19, 2012

(30) Foreign Application Priority Data

Jan. 19, 2011 (KR) .................. 10-2011-0005565

(51) Int. Cl.
*H03M 13/09* (2006.01)
(52) U.S. Cl.
USPC ........................................................ 714/758
(58) Field of Classification Search
USPC .................................. 714/776, 758
See application file for complete search history.

(56) References Cited

U.S. PATENT DOCUMENTS

| 7,530,003 | B2 * | 5/2009 | Lee et al. ................... 714/759 |
| 8,055,982 | B2 * | 11/2011 | Mulligan .................. 714/784 |
| 8,181,101 | B2 * | 5/2012 | Shen et al. ................ 714/823 |
| 2007/0268834 | A1 | 11/2007 | Buckley et al. |
| 2009/0241009 | A1 | 9/2009 | Kong et al. |

FOREIGN PATENT DOCUMENTS

| JP | 2001-036415 | | 2/2001 |
| JP | 2009-538050 | A | 10/2009 |
| KR | 1020090019784 | A | 2/2009 |
| KR | 1020090099756 | A | 9/2009 |
| WO | WO 2007/136913 | A3 | 11/2007 |

\* cited by examiner

*Primary Examiner* — James C Kerveros
(74) *Attorney, Agent, or Firm* — Myers Bigel Sibley & Sajovec

(57) ABSTRACT

A method of encoding/decoding data for storage and retrieval from a flash memory device, by generating a first error correction code on a combination of first user data to be stored in a first logical unit of storage in the flash memory device and padding data derived from second user data and an associated second error correction code stored in a second logical unit of storage in the flash memory device. The first user data and the first error correction code can be stored in the first logical unit of storage.

22 Claims, 11 Drawing Sheets

METHODS OF ENCODING/DECODING FOR ERROR CORRECTION CODE UTILIZING INTERDEPENDENT PORTIONS OF CODEWORDS AND RELATED CIRCUITS

CROSS-REFERENCE TO RELATED APPLICATIONS

This application claims the benefits, under 35 U.S.C. §119, to Korean Patent Application No. 10-2011-0005565 filed Jan.19, 2011, the entirety of which is incorporated by reference herein.

BACKGROUND

1. Field

Exemplary embodiments relate to a data encoding and decoding method, and more particularly, relate to an error correction code encoding and decoding method of a data storage device.

2. Description of the Related Art

A channel can be defined by a time interval from when data is stored in a data storage device to when the stored data is read from the data storage device. Further, this channel can be defined by a physical path through which the data storage device stores data and through which the stored data is read out from the data storage device.

Data may be contaminated when transmitted via the channel. That is, errors may occur in the data while the data is being transferred via the charnel. Before data is transmitted, transfer data may be generated by adding error correction codes (ECC) to the data. This operation may be referred to as "error correction code encoding". When the transfer data is received, the error correction codes can be separated from the transfer data and then original data may be recovered. This operation is sometimes referred to as "error correction code decoding".

As the error rate of the channel becomes large, error correction code encoding and decoding methods may be frequently utilized to correct errors in the data, which may complicate the system used to perform the error correction code encoding and decoding.

SUMMARY

Embodiments according to the inventive concept can provide methods of encoding/decoding for error correction code utilizing interdependent portions of codewords and related devices. Pursuant to these embodiments, a method of encoding/decoding data for storage in and retrieval from a flash memory device, can be provided by generating a first error correction code on a combination of first user data to be stored in a first logical unit of storage in the flash memory device and padding data that is derived from second user data and an associated second error correction code stored in a second logical unit of storage in the flash memory device that is directly adjacent to the first logical unit of storage. The first user data and the first error correction code can be stored in the first logical unit of storage.

In some embodiments according to the inventive concept, an error correction code encoding method can be provided by appending first padding data to first data. A first code word can be generated by encoding the first data and the first padding data. A portion of the first code word can be appended to second data as second padding data and a second code word can be generated by encoding the second data and the second padding data.

In some embodiments according to the inventive concept, an error correction code decoding method can be provided by generating a first code word by appending first padding data to first data and first parity data corresponding to the first data. The first code word can be decoded and a second code word can be generated by appending a portion of the first code word to second data and second parity data corresponding to the second data as second padding data and he second code word can be decoded.

In some embodiments according to the inventive concept, an ECC circuit can include an encoder circuit that is configured to generate a first error correction code on a combination of first user data to be stored in a first logical unit of storage in a flash memory device and padding data that is derived from second user data and an associated second error correction code stored in a second logical unit of storage in the flash memory device that is directly adjacent to the first logical unit of storage. A controller circuit can be coupled to the encoder circuit, and configured to store the first user data and the first error correction code in the first logical unit of storage.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION OF EMBODIMENTS ACCORDING TO THE INVENTIVE CONCEPT

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
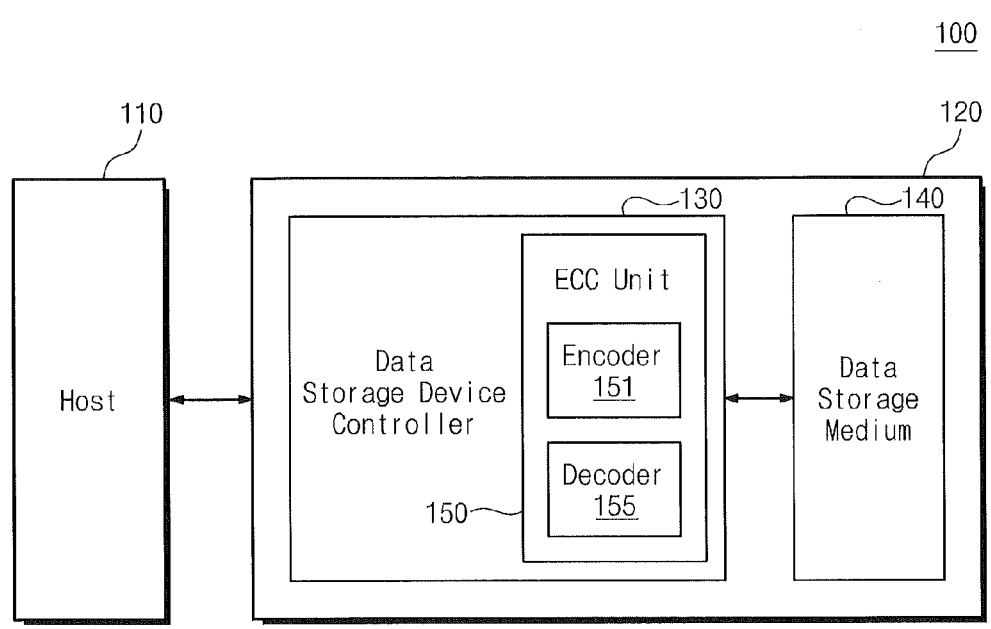
FIG. 1 is a block diagram of a user device including an error correction code processing unit according to an exemplary embodiment of the inventive concept.

FIG. 1 is a block diagram of a user device 100 including an error correction code (ECC) unit 150 according to an exemplary embodiment of the inventive concept. The user device 100 may include a host device 110 and a data storage device 120. The data storage device 120 may operate responsive to requests of the host device 110. For example, the data storage device 120 may store data transferred from the host device 110 or provide stored data to the host device 110.

The data storage device 120 may include a data storage device controller 130 and a data storage medium 140. The data storage device controller 130 may control an overall operation of the data storage device 120. In particular, the data storage device controller 130 may store data in the data storage medium 140 and read out data from the data storage medium 140.

The data storage device controller 130 may include the ECC unit 150 which is configured to detect and correct errors in data read out from the data storage medium 140. The ECC unit 150 may be hardware and/or software. The ECC unit 150 may include an ECC encoder (hereinafter, referred to as an encoder) 151 and an ECC decoder (hereinafter, referred to as a decoder) 155.

That is, the ECC unit 150 may include the encoder 151 which receives data to be stored in the data storage medium 140 and generates parity data of the received data based on an operation such as a division utilizing to a polynomial. Further, the ECC unit 150 may include a decoder 155 which receives a code word read out from the data storage medium 140 and performs an error detection and correction operation on the received code word.

In order to perform the above-described operation, the decoder 155 may include an error detecting part for detecting errors of an input code word and an error correcting part for correcting errors of the code word based on the error detection. Further, the encoder 151 and the decoder 155 may include at least one register to perform the encoding operation and decoding operation, respectively.

According to an exemplary embodiment of the inventive concept, the ECC unit 150 may use a portion of a previous code word as padding data of a current code word, upon encoding and decoding. As a result, code words may be interdependent. This means that an error correction capacity of the ECC unit 150 may be improved. The reliability of the data storage device 120 may be improved due to the ECC unit 150. The above-described padding data is also described with reference to FIG. 2.

In FIG. 1, there is exemplarily illustrated an example that the ECC unit 150 is included in the data storage device controller 130. But, the inventive concept is not limited to this disclosure. For example, the ECC unit 150 can be inside the data storage medium 140 or inside or outside of the data storage device controller 130, or as a function block included in the data storage device 120.

In the following embodiment, the data storage medium 140 may be a NAND flash memory device being a type of non-volatile memory device. But, the data storage medium 140 is not limited thereto. That is, the data storage medium 140 may be various devices capable of storing data. For example, the data storage medium 140 may be any one of a volatile memory device such as RAM and non-volatile memory devices such as a NOR flash memory device and a phase-change RAM (PRAM), a ferroelectric RAM (FRAM), and a magnet-coated disk (e.g., a platter).

Figure 2:
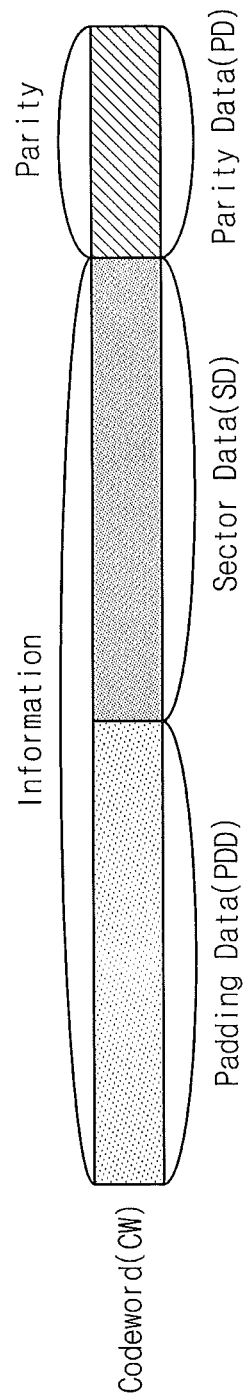
FIG. 2 is a diagram showing a code word processed by an ECC unit in FIG. 1.

FIG. 2 is a diagram showing a code word processed by an ECC unit in FIG. 1. A code word processed through an ECC unit 150 will be described with reference to FIGS. 1 and 2.

When data is stored in data storage medium 140, parity data PD generated through an encoder 151 may be stored with corresponding user data (i.e., data provided to the encoder 151). When data is read out from the data storage medium 140, stored user and parity data may be read out together, and a decoder 155 may detect and correct some errors in the read user data. Herein, data including both the parity data generated via the encoder 151 and user data may be called a code word CW. Further, data (i.e., decoded code word) decoded by the decoder 155 may be called a decoder input DI.

As set forth above, the data storage medium 140 may be a NAND flash memory device. The NAND flash memory device may perform a read/write operation by the page due to its structural characteristic. A page size of the NAND flash memory device may increase in proportion to the integrity thereof Setting of a processing unit of the ECC unit 150 to one page of the NAND flash memory device may cause an increase in a complexity of the ECC unit 150 and an increase in a space for storing parity data.

A page of a NAND flash memory device may be divided into plural logical blocks, and each logical block may be set to a processing unit of the ECC unit 150. The logical block may be called a sector. Below, user data provided to the encoder 151 and the decoder 155 may be called sector data SD.

An error correction capacity of the ECC unit 150 may be varied according to a characteristic of an error correction algorithm executed by the ECC unit 150 and a size of parity data. The error correction algorithm explicitly showing an error correction capacity may include a block code such as a BCH (Bose, Ray-Chaudhuri, Hocquenghem) code, an RS (Reed-Solomon) code, and so on. Such error correction codes may have a fixed length.

A length of a code word and a size of parity data may be fixed, and a size of sector data may typically be less than a size of information (i.e., code word size-parity data size) of a code word. For this reason, upon encoding, the encoder 151 may generate parity data by appending any data to the remaining information region. The data appended to the information region may be called padding data PDD.

In a code word, sector and parity data SD and PD other than padding data PDD may be stored in the data storage medium 140. At a decoding operation, padding data, which was appended at an encoding operation, may be appended to sector and parity data read out from the data storage medium 140.

In accordance with an exemplary embodiment of the inventive concept, upon encoding and decoding, the ECC unit 150 may use a portion of a previous code word as padding data of a current code word. As a result, since interdependence may exist between code words, an error correction capacity of the ECC unit 150 may be improved.

Figure 3:
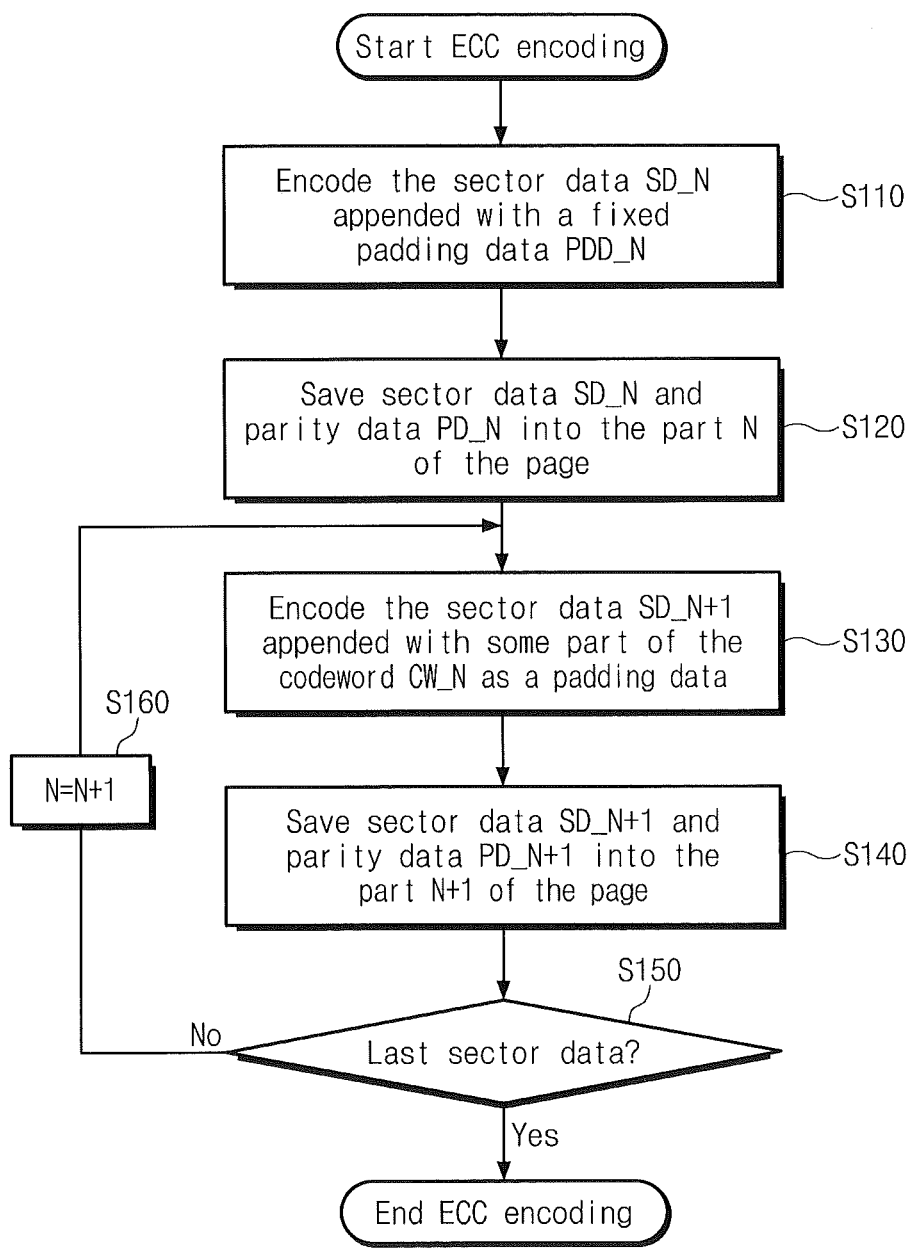
FIG. 3 is a flowchart of an error correction code encoding method according to an exemplary embodiment of the inventive concept.

FIG. 3 is a flowchart of an error correction code encoding method according to an exemplary embodiment of the inventive concept. Prior to description of the ECC encoding method, it is assumed that an encoder 151 in FIG. 1 receives sequential sector data (SD_N, SD_N+1, . . . ). Herein, the sequential sector data may represent that a sector data order is fixed logically or physically. Further, it is assumed that parity data generated by the encoder 151 and sector data corresponding to the parity data are stored separately in a page of a NAND flash memory device.

In operation S110, sector data SD_N may be encoded by appending padding data to the sector data SD_N. Herein, the padding data may be fixed to a specific constant pattern. If the sector data SD_N is encoded, a code word CW_N formed of padding data PDD_N, sector data SD_N and parity data PD_N may be produced. According to an exemplary embodiment of the inventive concept, at an encoding operation, a portion of a previous code word may be used as padding data of a current code word. But, since the sector data SD_N is sector data being firstly encoded, i.e., the first sector data, a previously encoded code word may not exist. There may be no code word used as padding data of the sector data SD_N. Accordingly, upon encoding of the sector data SD_N, padding data formed of a specific constant pattern may be appended.

In operation S120, the sector data SD_N and parity data PD_N corresponding to the sector data SD_N may be stored in the Nth part of a designated page (i.e., a page of a NAND flash memory device). The sector data SD_N may belong to data of the code word CW_N. But, occasionally, the operation S120 can be an operation where the sector data SD_N and the corresponding parity data PD_N to the sector data SD_N are sent to a NAND flash memory device.

In operation S 130, sector data SD_N+1 may be produced by appending padding data, formed of a portion of the code word (i.e., the previous code word) CW_N, to the sector data SD+1. If the sector data SD_N+1 is encoded, a code word CW_N+1 formed of padding data PDD_N+1, sector data SD_N+1 and parity data PD_N+1 may be generated. The padding data PDD_N+1 appended to the sector data SD_N+1 may be formed of a portion of the code word CW_N formed of the sector and parity data SD_N and PD_N. That is, the padding data PDD_N of the code word CW_N may not be included in the padding data PDD_N+1 appended to the sector data SD_N+1. Accordingly, in some embodiments according to the inventive concept, the padding used for the current codeword can be a portion of the data included in the previous codeword (and the parity associated therewith) but not the padding used for the previous codeword.

In operation S 140, the sector data SD_N+1 and the parity data PD_N+1 corresponding to the sector data SD_N+1 may be stored in the (N+1)th part of the designated page. The operation S140 may be understood to be an operation where the sector data SD_N+1 and the corresponding parity data PD_N+1 to the sector data SD_N+1 are sent to the NAND flash memory device.

In operation S150, there may be judged whether current sector data is last sector data. If not, the method proceeds to operation S160, in which a value N increases by 1 to designate next sector data. Afterwards, the method proceeds to operation S130. If current sector data is judged to be last sector data, the method may be ended. That is, the ECC encoding operation may be executed until the last sector data in the above-described manner, If the ECC encoding operation is executed in the above-described manner, an interdependence can be introduced such that generated code words are interconnected with one another like a chain. As a result, although the numbers of errors detected if a code word may exceed the capacity of the ECC to correct those errors using a single code word, it may be possible to correct the otherwise uncorrectable errors by utilizing other code words that have fewer errors, but were generated using a portion of the data and the parity from the code word having the uncorrectable errors.

Figure 4:
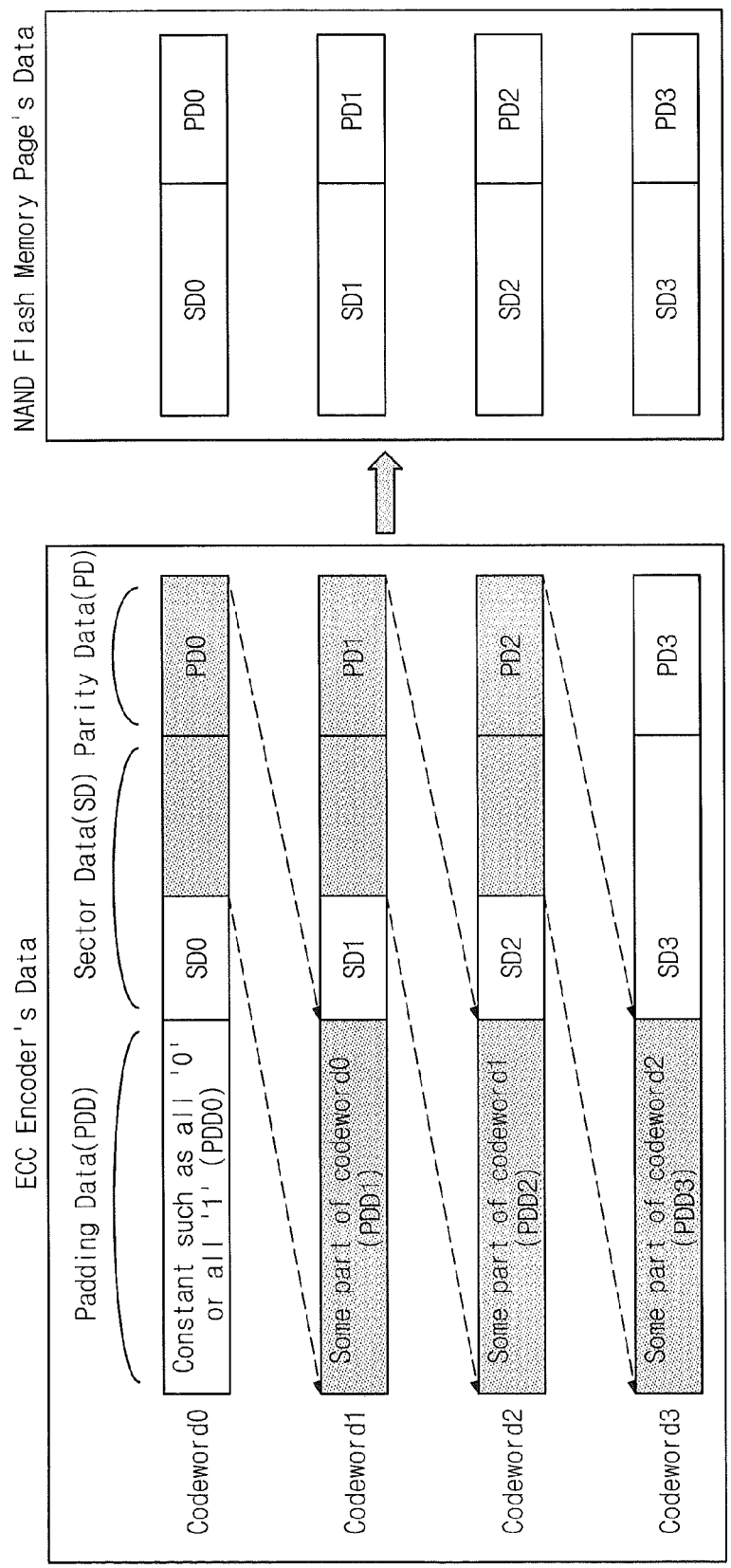
FIG. 4 is a diagram for describing an error correction code encoding method according to an exemplary embodiment of the inventive concept.

FIG. 4 is a diagram for describing an error correction code encoding method according to an exemplary embodiment of the inventive concept. For ease of description, in FIG. 4, it is assumed that four sector data SD0 to SD3 are encoded and then stored in one page of a NAND flash memory device.

An encoder 151 in FIG. 1 may generate parity data PD0 by appending padding data PDD0 to sector data SD0. At this time, since the sector data SD0 is sector data firstly received, the encoder 151 may append padding data PDD0 having a specific constant pattern as padding data. Exemplarily, the padding data PDD0 may be formed of data bits each having '0' or '1'.

After the sector data SD0 and the parity data PD0 in the code word codeword0 are stored in or sent to a NAND flash memory device, the encoder 151 may generate parity data PD1 by appending padding data PDD1 to next sector data, that is, sector data SD1. At this time, the encoder 151 may append padding data PDD1 formed of a portion of the code word codeword0 as padding data.

After the sector data SD1 and the parity data PD1 in the code word codeword1 are stored in or sent to the NAND flash memory device, the encoder 151 may generate parity data PD2 by appending padding data PDD2 to next sector data, that is, sector data SD2. At this time, the encoder 151 may append padding data PDD2 formed of a portion of the code word codeword1 as padding data.

Likewise, after the sector data SD2 and the parity data PD2 in the code word codeword2 are stored in or sent to the NAND flash memory device, the encoder 151 may generate parity data PD3 by appending padding data PDD3 to next sector data, that is, sector data SD3. At this time, the encoder 151 may append padding data PDD3 formed of a portion of the code word codeword3 as padding data.

Figure 5:
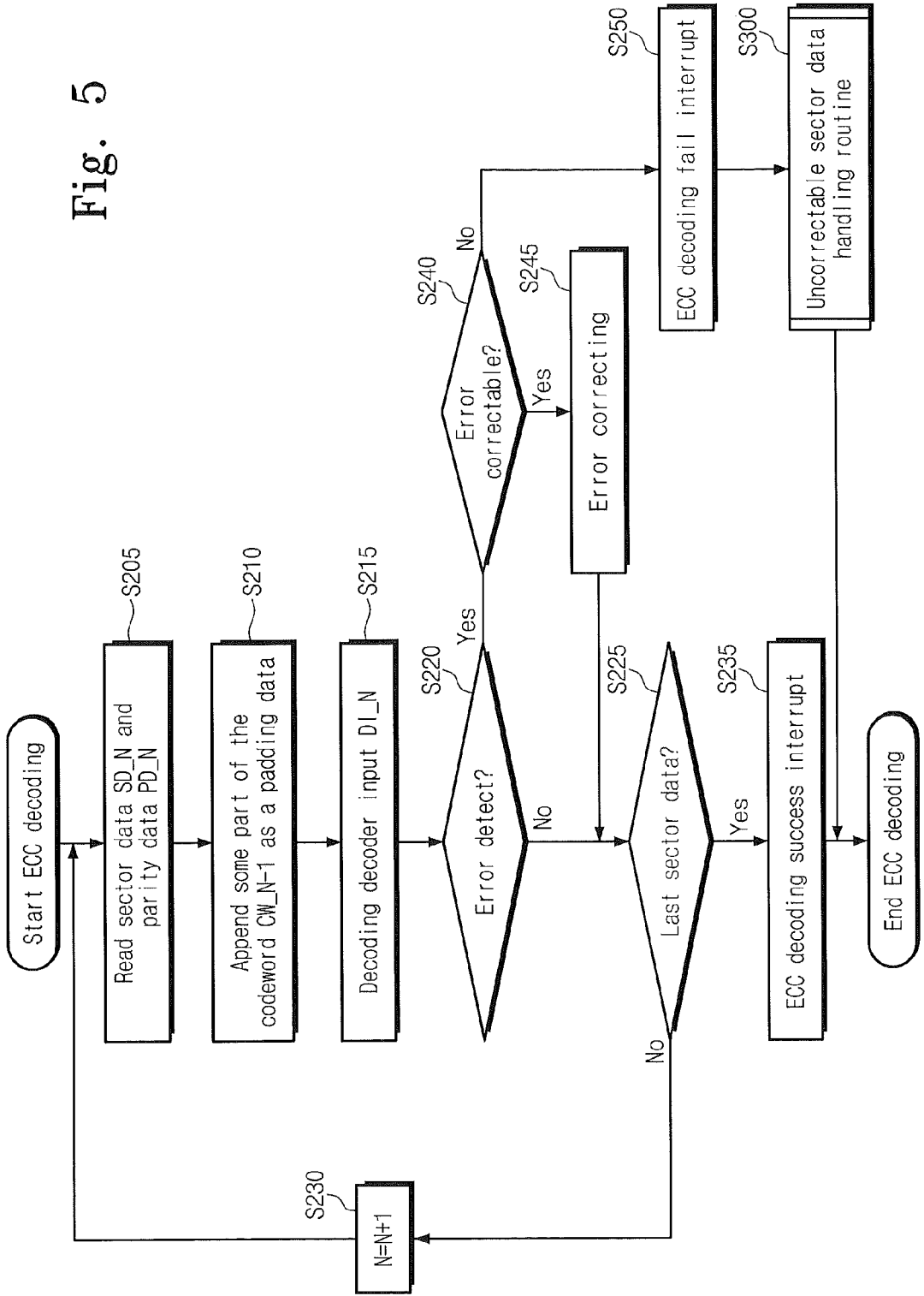
FIG. 5 is a flowchart showing an error correction code decoding method according to an exemplary embodiment of the inventive concept.

FIG. 5 is a flowchart showing an error correction code decoding method according to an exemplary embodiment of the inventive concept. Prior to description of the ECC decoding method, it is assumed that a decoder 155 in FIG. 1 is supplied with sequential sector data (SD_N, SD_N+1, . . . ) read out from a data storage medium 140 in FIG. 1. Further, as set forth in FIG. 2, it is assumed that data decoded through the decoder 155 is called a decoder input DI.

First of all, in operation 5205, sector data SD_N and parity data PD_N corresponding to the sector data SD_N may be read out. In operation S210, a code word CW_N may be produced by appending padding data formed of a portion of a code word CW_N−1, that is, a previous code word. In the event that the sector and parity data SD_N and PD_N are firstly decoded, the padding data appended in operation 5210 may be formed of a specific constant pattern as described in FIG. 3.

In operation 5215, a code word CW_N being decoded, that is, a decoder input DI_N may be decoded. The method may diverge according to the decoding result of the decoder input DI_N. That is, the method may diverge according to whether errors are detected in response to the decoder input DI_N (S220) and whether the detected errors are correctable (S240).

In the event that no errors are detected from the decoder input DI_N, an ECC decoding operation may be performed until the last sector data (S225 and S230). If the ECC decoding operation is executed without errors until the last sector data, in operation S235, an interrupt is generated indicating that the ECC decoding operation is completed, and the method may be ended.

If the detected errors are correctable, they may be corrected in operation 5245, and the method proceeds to operation 5225 such that the ECC decoding operation is executed until the last sector data.

If the detected errors are uncorrectable, in operation 5250, an interrupt may be generated to indicate that the ECC decoding operation failed. Then, the method may proceed to operation 5300, in which a sub routine is executed to process uncorrectable sector data. Occasionally, the operation 5250 can be skipped.

Figure 6:
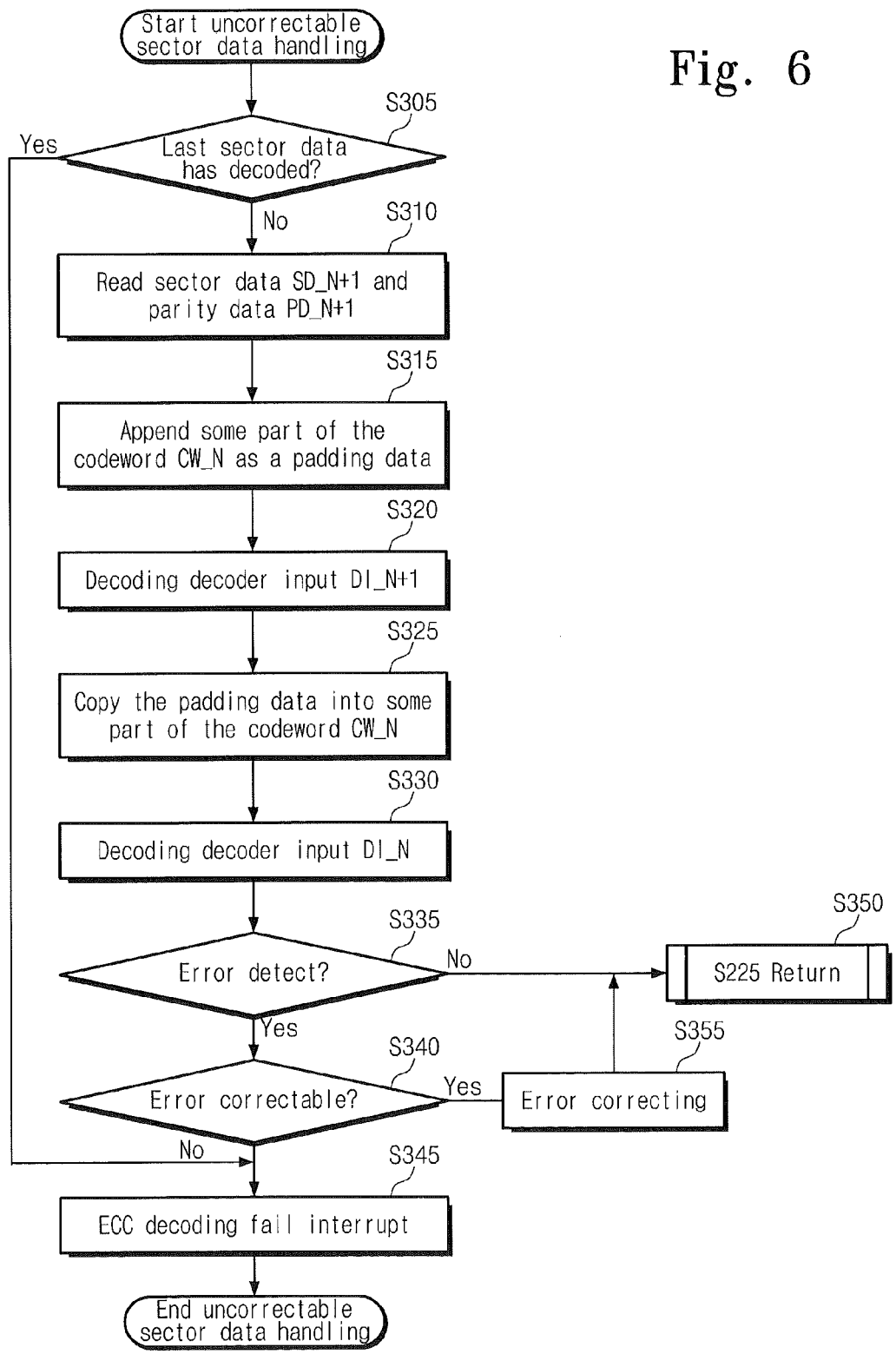
FIG. 6 is a flowchart illustrates processing of uncorrectable data in FIG. 5.

FIG. 6 is a flowchart showing processing of uncorrectable data in FIG. 5.

According to an exemplary embodiment of the inventive concept, an encoding operation may be executed such that code words are interdependent by incorporating a portion of a previous code word as padding data of a current code word. It is possible to correct uncorrectable data errors using the interdependence between code words. For example, the number of bit errors in a current code word may be reduced (to within the number of bit errors that are correctable) by copying padding data of an ECC correction completed next cord word to a current code word. As a result, since the number of bits in error in the current code word is then within the error correction capacity of the decoder 155 in FIG. 1, the remaining errors in the current code word may also be corrected so that the code word is ultimately provided as error-free.

In operation 5305, there may be judged whether last sector data is decoded. If a decoder input DI_N is a decoder input on the last sector data or if the last sector data is previously decoded, padding data of a next cord word may not exist. In this case, in operation S345, an interrupt may be generated to indicate that the ECC decoding operation failed. Afterwards, the method may be ended (return to an end procedure in FIG. 5).

In the event that the current decoder input DI_N is not a decoder input on the last sector data and the last sector data is not decoded, the uncorrectable sector data may be processed as follows.

In operation S310, sector data SD_N+1 and parity data PD_N+1 corresponding to the sector data SD_N+1 may be read out. That is, next sector data of uncorrectable current sector data SD_N and corresponding parity data may be read out. In operation S315, a code word CW_N+1 may be generated by appending padding data formed of a portion of the code word CW_N.

In operation, S320, a code word CW_N+1 being decoded, that is, a decoder input DI_N+1 may be decoded. If an error detected from the decoder input DI_N+1 is uncorrectable, the method may proceed to operation S305 to perform a decoding operation on a next decoder input. That is, the operations S305 to S320 may be repeated until an error is not detected from a next decoder input or a detected error is correctable.

In operation S325, padding data of the decoded decoder input DI_N+1 may be copied to the code word CW_N. This means that a portion of the code word used as padding data of the decoder input DI_N+1 is recovered. An operation 5325 may be executed when no error is detected from a decoder input DI_N+1 in operation 5320 or when an error detected from a decoder input DI_N+1 is correctable.

After a portion of the code word CW_N is recovered, in operation S330, the decoder input DI_N may be decoded. The method may diverge according to a decoding result of the decoder input DI_N. If no error is detected from the decoder input DI_N in operation S335, the method may return to operation S225 in FIG. 5 to perform an ECC decoding operation on remaining sector data. If a detected error is judged to be correctable in operation S340, the detected error may be corrected in operation 5355. The method may return to operation 5225 in FIG. 5 to perform an ECC decoding operation on remaining sector data.

If a detected error is judged to be uncorrectable in operation S340, in operation S345, an interrupt may be generated to indicate that the ECC decoding operation is failed. Afterward, the method may be ended (return to an end procedure in FIG. 5).

If ECC decoding is made, uncorrectable errors may be corrected according to the interdependence between code words although the number of errors may exceed the error correction capacity of the decoder.

Figure 7:
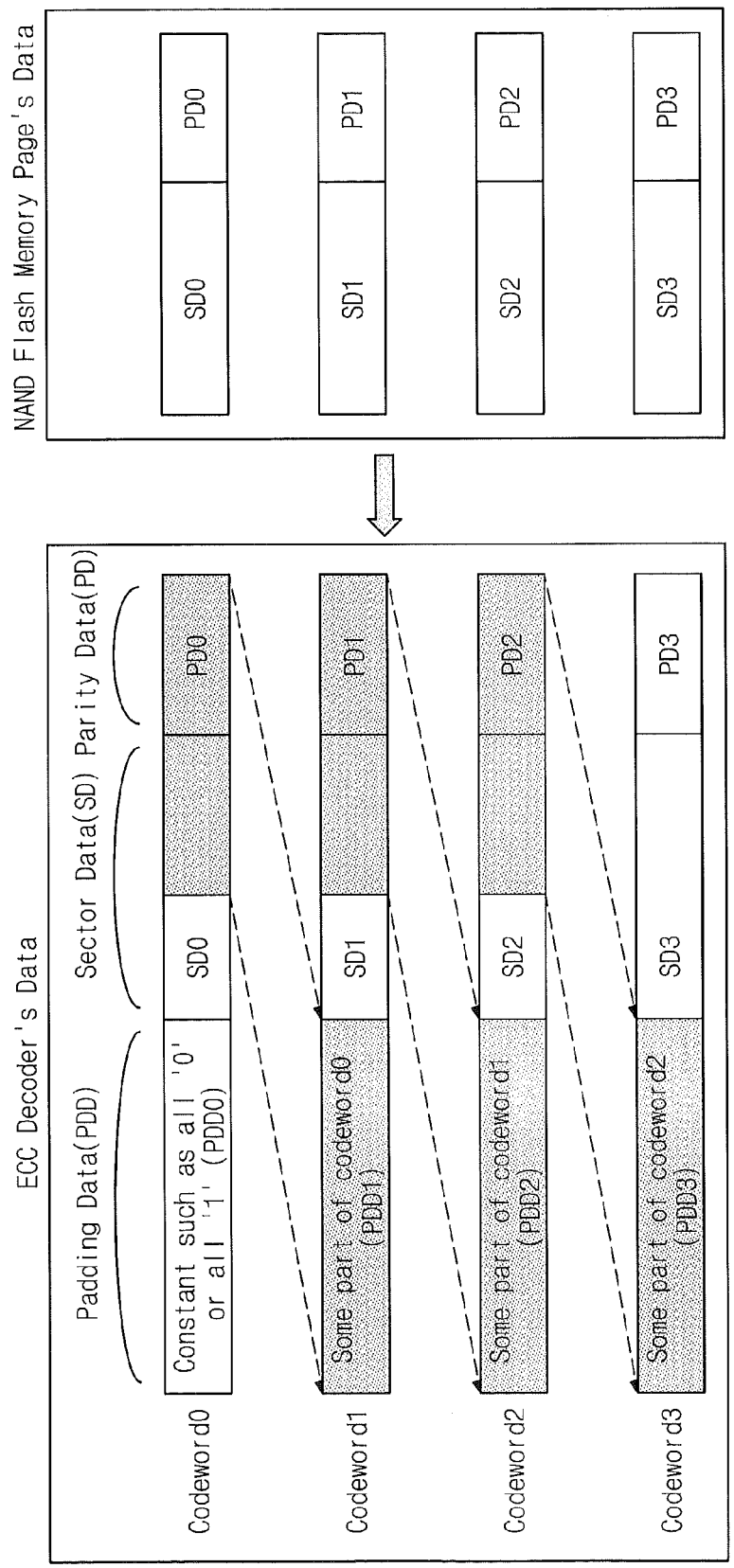
FIGS. 7 and 8 are diagrams showing an error correction code decoding method according to an exemplary embodiment of the inventive concept.
Figure 8:
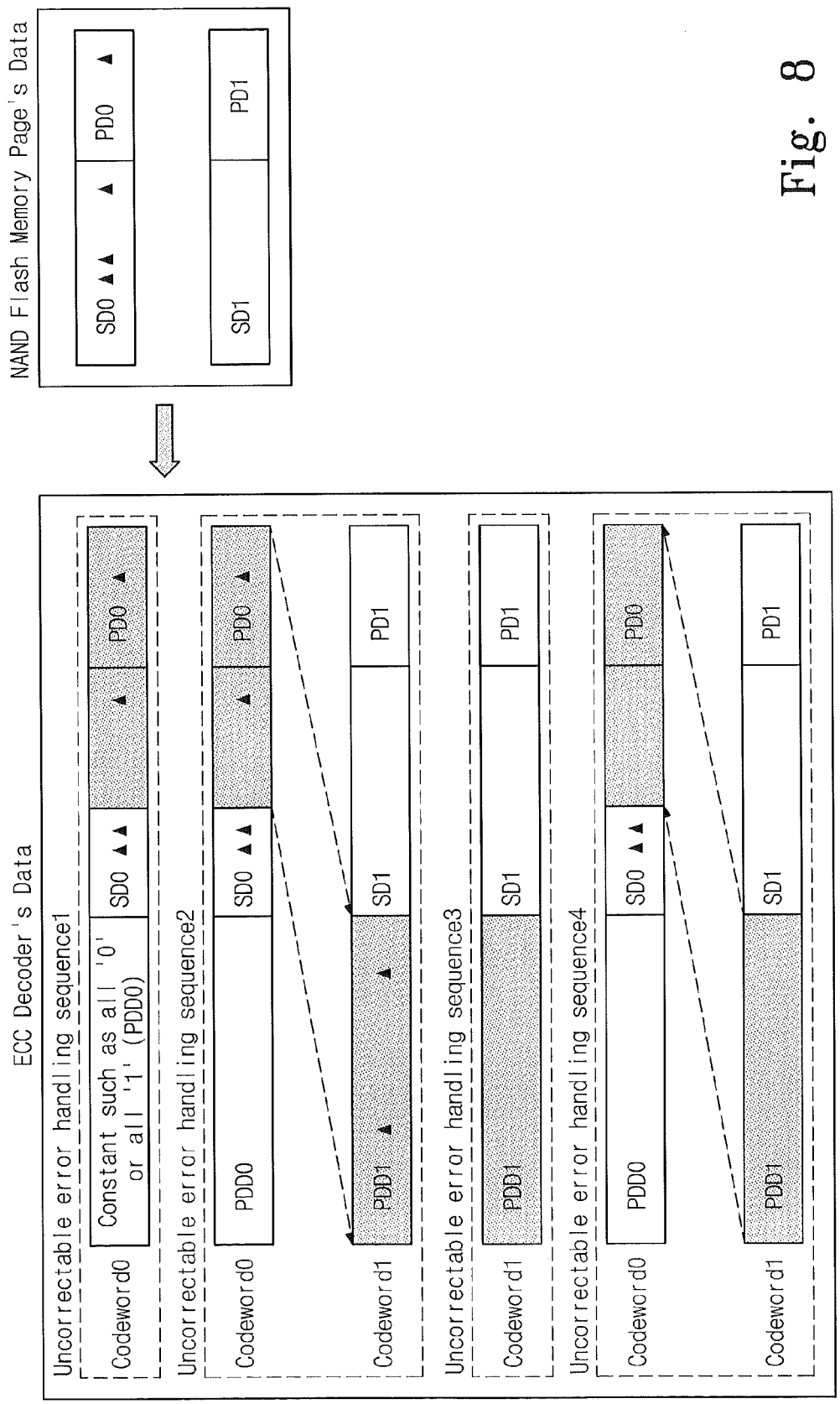

An error correction code decoding method is described with reference to FIGS. 7 and 8 showing a simplified data flow.

FIG. 7 is a diagram showing an error correction code decoding method according to an exemplary embodiment of the inventive concept. For ease of description, in FIG. 7, there is exemplarily illustrated an example that four sector data SD0 to SD3 and corresponding parity data PD0 to PD3 stored in one page of a NAND flash memory device are decoded.

A decoder 155 in FIG. 1 may generate parity data by appending padding data PDD0 to received sector data SD0. At this time, since the sector data SD0 is firstly received sector data, the decoder 155 may append padding data PDD0 having a specific constant pattern as padding data. Exemplarily, the padding data PDD0 may be formed of data bits each having '0' or '1'. Parity data generated with respect to sector data SD0 may be compared with parity data PD0 received from the NAND flash memory device, and errors of the sector data SD0 may be detected and corrected.

The decoder 155 may generate parity data by appending padding data PDD1 to next sector data, that is, sector data SD1. At this time, the decoder 155 may append the padding data PDD1 formed of a portion of a code word codeword0 as padding data. Parity data generated with respect to the sector data SD1 may be compared with parity data PD1 received from the NAND flash memory device, and errors of the sector data SD1 may be detected or corrected.

Likewise, the decoder 155 may generate parity data by appending padding data PDD2 to next sector data, that is, sector data SD2. At this time, the decoder 155 may append the padding data PDD2 formed of a portion of a code word codeword1 as padding data. Parity data generated with respect to the sector data SD2 may be compared with parity data PD2 received from the NAND flash memory device, and errors of the sector data SD2 may be detected or corrected.

Likewise, the decoder 155 may generate parity data by appending padding data PDD3 to next sector data, that is, sector data SD3. At this time, the decoder 155 may append the padding data PDD3 formed of a portion of a code word codeword2 as padding data. Parity data generated with respect to the sector data SD3 may be compared with parity data PD3 received from the NAND flash memory device, and errors of the sector data SD3 may be detected or corrected.

FIG. 8 is a diagram showing an error correction code decoding method according to an exemplary embodiment of the inventive concept. In FIG. 8, there is illustrated a method (i.e.,. a method in FIG. 6) of processing uncorrectable error data. For ease of description, in FIG. 8, it is assumed that two sector data SD0 and SD1 and corresponding parity data PD0 and PD1 stored in one page of a NAND flash memory device are decoded. It is further assumed that a decoder 155 in FIG. 1 can correct 2-bit data. But, it is well understood that the decoder 155 is configured to have a 1-bit error correction capacity. In FIG. 8, a symbol '▲' may represent an error bit. For example, sector data SD0 may include four error bits, and sector data SD1 may not include an error bit.

Referring to an error handling sequence 1, the decoder 155 may generate parity data by appending padding data PDD0 to received sector data SD0. At this time, since the sector data SD0 is firstly received sector data, the decoder 155 may append padding data PDD0 having a specific constant pattern as padding data. Exemplarily, the padding data PDD0 may be formed of data bits each having '0' or '1'. Parity data generated with respect to sector data SD0 may be compared with parity data PD0 received from a NAND flash memory device, and four error bits may be detected. Since the decoder 155 has a 2-bit error correction capacity, errors of a decoder input (i.e., a decoded code word 0) may be uncorrectable, if not processed further.

Referring to an error handling sequence 2, the decoder 155 may stop decoding the uncorrectable decoder input 0 and then decode next sector data, that is, sector data SD1. At this time, the decoder 155 may generate parity data by appending padding data PDD1 to the sector data SD1. At this time, the decoder 155 may append the padding data PDD1 formed of a portion of a code word code word 0 as padding data. Parity data generated with respect to the sector data SD1 may be compared with parity data PD1 received from a NAND flash memory device, and two error bits may be detected.

Referring to an error handling sequence 3, since the decoder 155 has a 2-bit error correction capacity, an error of the decoder input 1 (i.e.,. a decoded code word 1) may be correctable, Accordingly, the decoder 155 may correct the error in the decoder input 1.

Referring to an error handling sequence 4, corrected padding data PDD1 of the correction-completed code word codeword1 may be copied to the code word codeword 0. The corrected padding data PDD1 of the code word codeword1 replaces the portion of the code word codeword0 that includes the 2-bit error. The decoder 155 may again decode the decoder input 0 now having only 2 bits in error due to the inclusion of the corrected padding data PDD1. Accordingly, the decoder 155 may correct the errors in the decoder input 0 and complete a decoding operation on all sector data.

Figure 9:
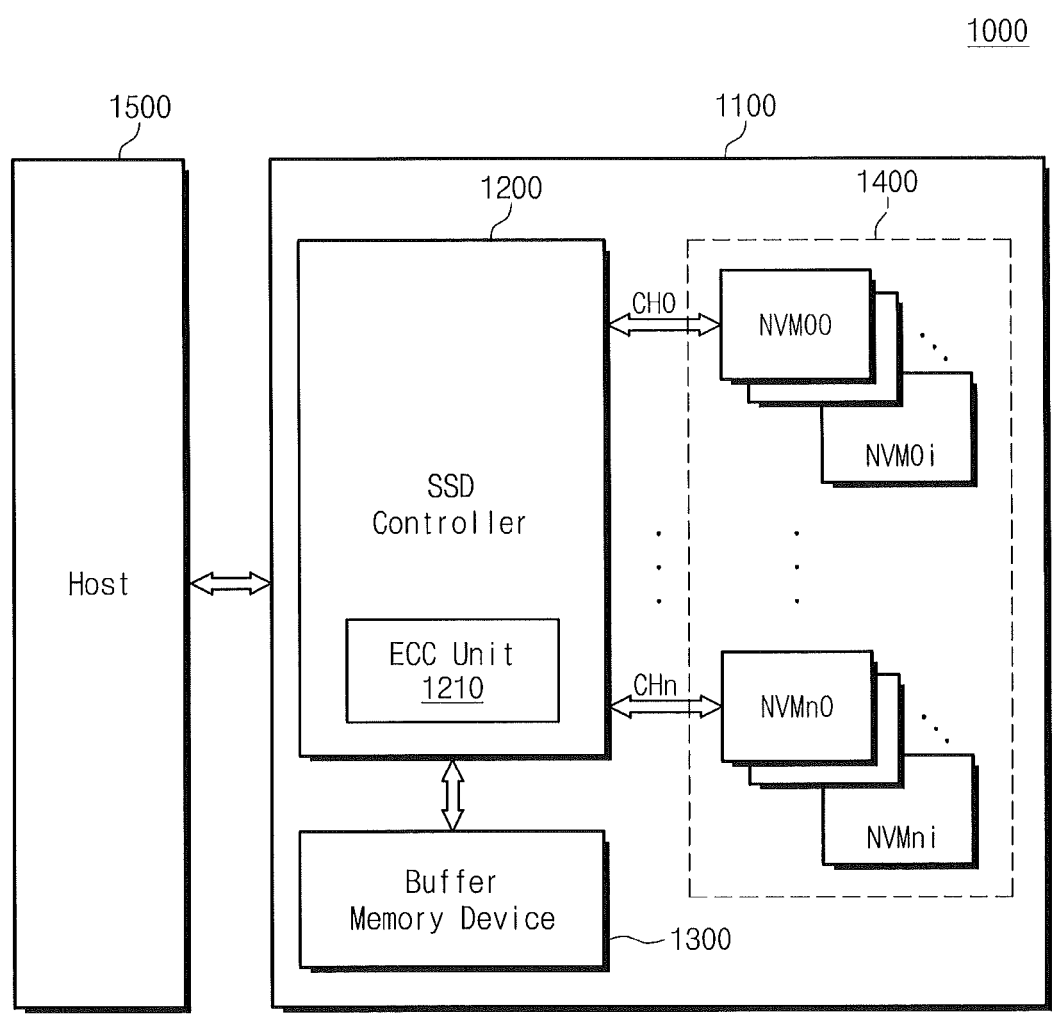
FIG. 9 is a block diagram of another user device including an ECC unit according to an exemplary embodiment of the inventive concept.

FIG. 9 is a block diagram of another user device including an ECC unit according to an exemplary embodiment of the inventive concept.

Referring to FIG. 9, a user device 1000 may include a data storage device (DSD) and a host device 1500. The data storage device may be a solid state drive (SSD) 1100. The SSD 1100 may include an SSD controller 1200, a buffer memory device 1300, and storage medium 1400. The SSD 1100 according to an exemplary embodiment of the inventive concept may further include an auxiliary power supply having super capacitors. The auxiliary power supply may power the SSD 1100 at sudden power-off.

The SSD 1100 may operate responsive to an access request of the host 1500. That is, the SSD controller 1200 may respond to a request from the host 1500 to access the storage medium 1400. For example, the SSD controller 1200 may be configured to control read, write and erase operations of the storage medium 1400. The buffer memory device 1300 may temporarily store data to be stored in the storage medium 1400. Further, the buffer memory device 1300 may temporarily store data read out from the storage medium 1400. Data stored in the buffer memory device 1300 may be transferred to the storage medium 1400 or the host 1500 according to the control of the SSD controller 1200.

The SSD controller 1200 may be connected with the storage medium 1400 via a plurality of channels CH0 to CHn, each of which is connected with a plurality of non-volatile memory devices (NVM00 to NVM0i) to (NVMn0 to NVMni). A plurality of non-volatile memory devices may share a channel. The storage medium 1400 may be a NAND flash memory device according to an exemplary embodiment of the inventive concept. But, it is well understood that the storage medium 1400 is not limited to the NAND flash memory device. For example, the storage medium 1400 may be formed of one of non-volatile memory devices such as a NOR flash memory device, a phase-change RAM (PRAM), a ferroelectric RAM (FRAM), a magnetic RAM (MRAM), and so on.

The SSD controller 1200 may include an ECC unit 1210 according to an exemplary embodiment of the inventive concept. The ECC unit 1210 may use a portion of a previous code word as padding data of a current code word at encoding and decoding. As a result, code words may be interdependent. This means that an error correction capacity of the ECC unit 1210 may be improved. It is possible to improve the reliability of the data storage device 1100 through the ECC unit 1210.

Figure 10:
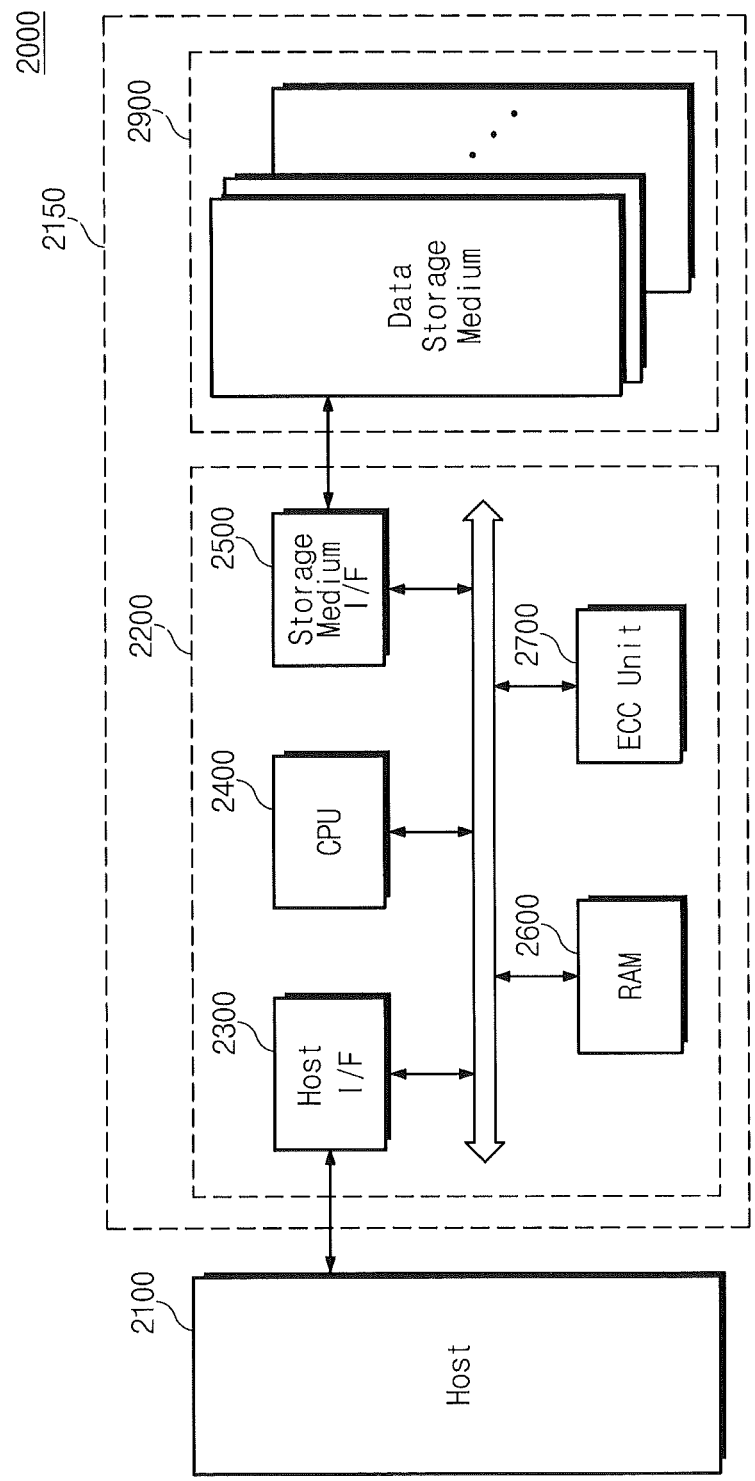
FIG. 10 is a block diagram of still another user device including an ECC unit according to an exemplary embodiment of the inventive concept.

FIG. 10 is a block diagram of still another user device including an ECC unit according to an exemplary embodiment of the inventive concept.

Referring to FIG. 10, a user device 2000 may include a host device 2100 and a data storage device 2150. The data storage device 2150 may include a controller 2200 and data storage medium 2900 including a plurality of data storage medium.

The controller 2200 may be connected to the host 2100 and the data storage medium 2900. The controller 2200 may respond to a request from the host 2100 to access the data storage medium 2900. For example, the controller 2200 may be configured to control read, write and erase operations of the data storage medium 2900. The controller 2200 may be configured to provide an interface between the data storage medium 2900 and the host 2100. The controller 2200 may be configured to drive firmware for controlling the data storage medium 2900.

The controller 2200 may include constituent elements such as a RAM 2600, a CPU 2400, a host interface 2300, an ECC unit 2700, and a data storage medium interface 2500. The RAM 2600 may be used as a working memory of the CPU 2400. The CPU 2400 may control overall operation of the controller 2200.

The host interface 2300 may include a protocol for executing data exchange between the host 2100 and the controller 2200. For example, the controller 2200 may be configured to communicate with an external device (for example, a host) through at least one of various interface protocols such as Universal Serial Bus (USB) protocol, MultiMedia Card (MMC) protocol, Peripheral Component Interconnection (PCI) protocol, PCI-express (PCI-E) protocol, Advanced Technology Attachment (ATA) protocol, Serial-ATA protocol, Parallel-ATA protocol, Small Computer Small Interface (SCSI) protocol, Enhanced Small Disk Interface (ESDI) protocol, Integrated Drive Electronics (IDE) protocol, and the like.

The ECC unit 2700 may be configured to detect errors in the data read from the data storage medium 2900 and to correct the detected errors if possible. The ECC unit 2700 may use a portion of a previous code word as padding data of a current code word at encoding and decoding. As a result, code words may be interdependent. This means that an error correction capacity of the ECC unit 2700 maybe improved.

The data storage medium interface 2500 may provide an interface between the data storage medium 2900 and the controller 2200.

It is well understood that the controller 2200 is not limited to this disclosure. For example, the controller 2200 may further include a ROM which stores code data needed for an initial booting operation and data for interfacing with the host 2100.

The controller 2200 and the data storage medium 2900 may be integrated in single semiconductor device to form a memory card such as a PCMCIA (personal computer memory card international association) card, a CF (compact flash) card, a smart media card, a memory stick, a multi media card (MMC, RS-MMC, MMC-micro), an SD card (SD, Mini-SD, Micro-SD, SDHC), UFS (universal flash storage), and so on.

In some embodiments, the controller 2200 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information wirelessly, one of various electronic devices constituting a home network, one of various electronic devices constituting a computer network, one of various electronic devices constituting a telematics network, RFID, an embedded system, or one of various electronic devices constituting a computing system.

In some embodiments, the controller 2200 or the data storage medium 2900 may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 11:
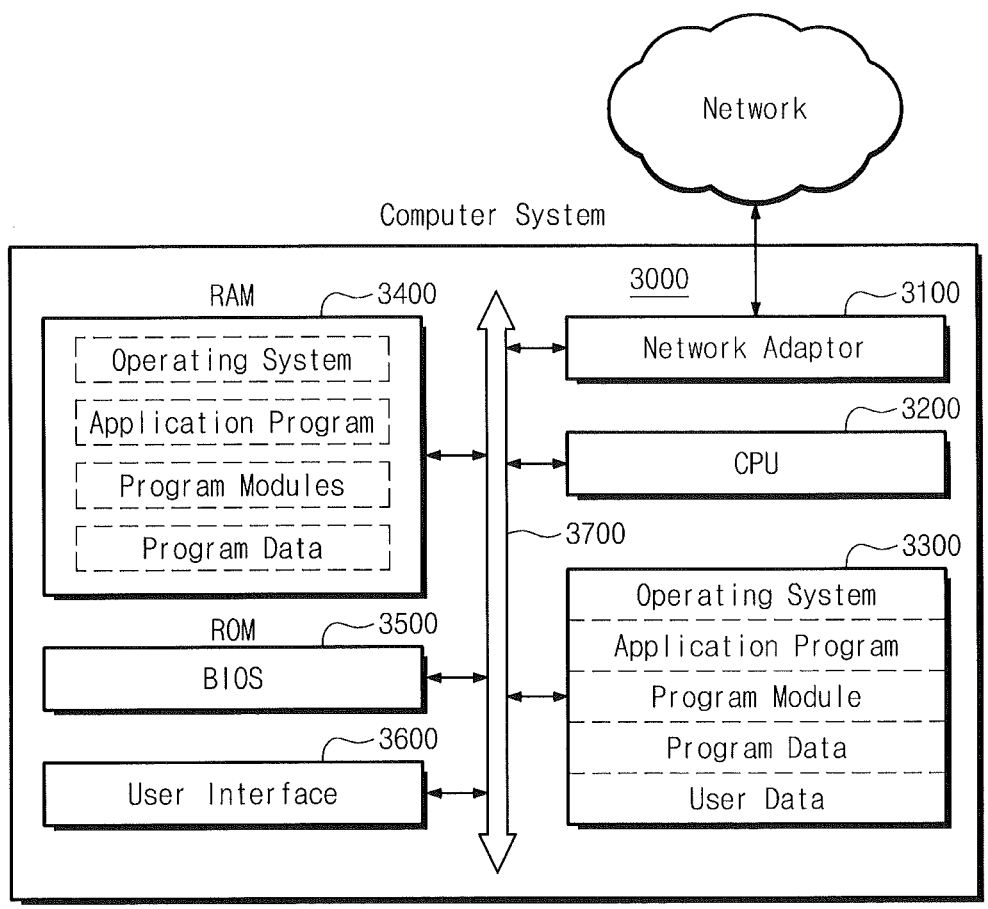
FIG. 11 is a block diagram of a computing system including a data storage device in FIG. 9.

FIG. 11 is a block diagram of a computing system including a data storage device in FIG. 9.

A computer system 3000 may include a network adaptor 3100, a CPU 3200, a data storage device 3300, a RAM 3400, a ROM 3500, and a user interface 3600 which are electrically connected to a system bus 3700. Herein, the data storage device 3300 may be formed of a data storage device in FIG. 9. Alternatively, the data storage device 3300 may be formed of a data storage device in FIG. 10.

The network adaptor 3100 may provide an interface between the computer system 3000 and external networks. The CPU 3200 may control an overall operation for driving an operating system and an application program which are resident in the RAM 3400. The data storage device 3300 may store data needed for the computer system 3000. For example, the data storage device 3300 may store an operating system for driving the computer system 3000, an application program, various program modules, program data, user data, and the like.

The RAM 3400 may be used as a working memory of the computer system 3000. Upon booting, the operating system, the application program, the various program modules, and program data needed to drive programs and various program modules read out from the data storage device 3300 may be loaded in the RAM 3400. The ROM 3500 may store a basic input/output system (BIOS) which is activated before the operating system is driven upon booting. Information exchange between the computer system 3000 and a user may be made via the user interface 3600.

In addition, the computer system 3000 may further include a battery, a modem, and the like. The computer system 3000 may further include an application chipset, a camera image processor (CIS), a mobile DRAM, and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An error correction code encoding method comprising:
   appending a first padding data to a first data;
   generating a first code word by error correction code (ECC) encoding the first data and the first padding data;
   appending a portion of the first code word to a second data wherein the portion of the first code word is a second padding data; and
   generating a second code word by ECC encoding the second data and the second padding data.

2. The error correction code encoding method of claim 1, wherein the first code word includes the first data and a first ECC parity data generated according to the ECC encoding of the first data and the first padding data.

3. The error correction code encoding method of claim 2, wherein a portion of the first code word appended as the second padding data is formed of a portion of both the first data and the first ECC parity data.

4. The error correction code encoding method of claim 1, wherein the first padding data comprises a pattern.

5. The error correction code encoding method of claim 1, wherein the first data is ECC encoded prior to the ECC encoding of the second data.

6. An error correction code decoding method comprising:
generating a first code word by appending a first padding data to a first data and a first ECC parity data corresponding to the first data;
decoding the first code word;
generating a second code word by appending a portion of the first code word to a second data and a second ECC parity data corresponding to the second data wherein the portion of the first code word is a second padding data; and
decoding the second code word.

7. The error correction code decoding method of claim 6, wherein the portion of the first code word appended to the second padding data is a portion of the first data and the first ECC parity data.

8. The error correction code decoding method of claim 6, wherein the first padding data is formed of a specific constant pattern.

9. The error correction code decoding method of claim 6, wherein the first data is decoded prior to the second data.

10. The error correction code decoding method of claim 9, wherein the decoding the first code word comprises:
detecting an error of the first code word; and
correcting the detected error of the first code word.

11. The error correction code decoding method of claim 10, wherein the decoding the second code word comprises:
detecting an error of the second code word; and
correcting the detected error of the second code word.

12. The error correction code decoding method of claim 11, further comprising, when an uncorrectable error is detected from the first code word,
generating a second code word whose error is corrected by the correcting the detected error of the second code word;
copying padding data of the error-corrected second code word to the first code word; and
decoding the first code word to which the padding data of the second code word is copied.

13. The error correction code decoding method of claim 10, wherein the detecting an error of the first code word comprises:
generating ECC parity data on the first data and the first padding data; and
comparing the generated ECC parity data with the first ECC parity data.

14. A method of encoding/decoding data for storage in a flash memory device, the method comprising:
generating a first error correction code on a combination of a first user data to be stored in a first logical unit of storage in the flash memory device and a padding data derived from a second user data and an associated second error correction code stored in a second logical unit of storage in the flash memory device; and
storing the first user data and the first error correction code in the first logical unit of storage.

15. The method of claim 14 wherein the padding data comprises less than all of the second user data.

16. The method of claim 14 wherein storing the first user data and the first error correction code in the first logical unit of storage further comprises:
storing the first user data and the first error correction code without the padding data.

17. The method of claim 14 further comprising:
reading the first user data and the first error correction code from the first logical unit of storage;
appending the padding data derived from the second user data to the first user data to provide a first codeword;
decoding the first codeword using the first error correction code to detect whether a correctable error or an uncorrectable error exists in the first codeword;
if the uncorrectable error exists in the first codeword, reading a third user data and a third error correction code from a third logical unit of storage; and
appending padding data derived from the first user data to the third user data to provide a second codeword.

18. The method of claim 17 further comprising:
decoding the second codeword using the third error correction code to detect whether a correctable error or an uncorrectable error exists in the second codeword; and
if the correctable error exists in the second codeword, correct the correctable error including any errors in the padding data derived from the first user data to provide corrected padding data;
replacing a portion of the first user data from which the corrected padding data was derived to reduce the uncorrectable error in the first codeword to a correctable error in the first codeword; and
correcting the correctable error in the first codeword to provide a corrected first codeword.

19. The method of claim 18 wherein the padding data derived from the first user data comprises less than all of the combination of the first user data and the first error correction code.

20. An ECC circuit comprising:
an encoder circuit configured to generate a first error correction code on a combination of a first user data to be stored in a first logical unit of storage in a flash memory device and a padding data derived from a second user data and an associated second error correction code stored in a second logical unit of storage in the flash memory device; and
a controller circuit, coupled to the encoder circuit, configured to store the first user data and the first error correction code in the first logical unit of storage.

21. The circuit of claim 20 wherein the controller circuit is configured to read data from the flash memory device, the circuit further comprising:
a decoder circuit, coupled to the controller circuit, configured to the receive the first user data and the first error correction code read from the first logical unit of storage and to append the padding data derived from the second user data to first user data to provide a first codeword
wherein the decoder circuit is further configured to decode the first codeword using the first error correction code to detect whether a correctable error or an uncorrectable error exists in the first codeword and configured, if the uncorrectable error exists in the first codeword, to read a third user data and a third error correction code from a third logical unit of storage, and configured to append padding data derived from the first user data to the third user data to provide a second codeword.

22. The circuit of claim 21 wherein the decoder circuit is further configured to decode the second codeword using the third error correction code to detect whether a correctable error or an uncorrectable error exists in the second codeword, and configured, if the correctable error exists in the second codeword, to correct the correctable error including any errors in the padding data derived from the first user data to provide a corrected padding data, and configured to replace a portion of the first user data from which the corrected padding data was derived to reduce the uncorrectable error in the first codeword to a correctable error in the first codeword, and configured to correct the correctable error in the first codeword to provide a corrected first codeword.

\* \* \* \* \*